(12) United States Patent
Dolganov et al.

(10) Patent No.: US 12,374,859 B2
(45) Date of Patent: Jul. 29, 2025

(54) SQUARE PULSE LASER DRIVER FOR VERTICAL CAVITY SURFACE EMITTING LASER ARRAYS

(71) Applicant: Lumentum Operations LLC, San Jose, CA (US)

(72) Inventors: Mikhail Dolganov, Gilroy, CA (US); Hao Huang, San Jose, CA (US); Lijun Zhu, Dublin, CA (US)

(73) Assignee: Lumentum Operations LLC, San Jose, CA (US)

( * ) Notice: Subject to any disclaimer, the term of this patent is extended or adjusted under 35 U.S.C. 154(b) by 836 days.

(21) Appl. No.: 17/301,324

(22) Filed: Mar. 31, 2021

(65) Prior Publication Data

US 2022/0059983 A1    Feb. 24, 2022

Related U.S. Application Data

(60) Provisional application No. 63/067,110, filed on Aug. 18, 2020.

(51) Int. Cl.
  *H01S 5/042* (2006.01)
  *H01S 5/026* (2006.01)
  *H01S 5/42* (2006.01)

(52) U.S. Cl.
  CPC .......... *H01S 5/0261* (2013.01); *H01S 5/0428* (2013.01); *H01S 5/423* (2013.01)

(58) Field of Classification Search
  CPC . H01S 5/0428; H01S 5/06216; H01S 5/06226
  See application file for complete search history.

(56) References Cited

U.S. PATENT DOCUMENTS

| | | | |
|---|---|---|---|
| 6,697,402 B2* | 2/2004 | Crawford | H01S 5/042 372/38.03 |
| 11,114,820 B2* | 9/2021 | Zhu | H03K 5/12 |
| 2014/0139605 A1* | 5/2014 | Fujita | G02B 26/127 347/118 |
| 2019/0229493 A1* | 7/2019 | Stern | H01S 5/0428 |
| 2021/0333362 A1* | 10/2021 | Huang | G01S 17/10 |
| 2022/0224076 A1* | 7/2022 | Ando | H01S 5/0428 |

OTHER PUBLICATIONS

Co-pending U.S. Appl. No. 62/993,419, entitled "Method for Shaping Pulses Using Multi-Section Vertical-Cavity Surface-Emitting Laser Array", by Hao Huang et al., filed Mar. 23, 2020, 17 pages.
Co-pending U.S. Appl. No. 16/948,680, entitled "Rectangular Pulse Driving Circuit Using Cathode Pre-Charge and Cathode-Pull Compensation", by Hao Huang et al., filed Sep. 29, 2020, 46 pages.

* cited by examiner

*Primary Examiner* — Minsun O Harvey
*Assistant Examiner* — Fernanda Adriana Camacho Alanis
(74) *Attorney, Agent, or Firm* — Harrity & Harrity, LLP

(57) ABSTRACT

A charged inductive laser driver may be configured to provide a pre-emphasized current to a first laser load and a second laser load, wherein the pre-emphasized current is configured to achieve a square pulse as a combined output of the first laser load and the second laser load.

12 Claims, 7 Drawing Sheets

SQUARE PULSE LASER DRIVER FOR VERTICAL CAVITY SURFACE EMITTING LASER ARRAYS

CROSS-REFERENCE TO RELATED APPLICATION

This Patent application claims priority to U.S. Provisional Patent Application No. 63/067,110, filed on Aug. 18, 2020, and entitled "LASER DRIVER FOR VERTICAL CAVITY SURFACE EMITTING LASERS." The disclosure of the prior Application is considered part of and is incorporated by reference into this Patent Application.

TECHNICAL FIELD

The present disclosure relates generally to lasers and laser drivers, and to electrical drive circuits for driving a laser load of a vertical cavity surface emitting laser (VCSEL) to emit a square shaped optical pulse using current pre-emphasis.

BACKGROUND

Time-of-flight-based (TOF-based) measurement systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses. For some applications, a rectangular shaped pulse may be emitted into a field of view. TOF-based measurement systems are but one application of rectangular shaped optical pulses. A rectangular shaped pulse (also referred to as a square shaped pulse, a square wave, or a pulse wave, among other examples) is a non-sinusoidal periodic waveform in which an amplitude alternates at a steady frequency between fixed minimum and maximum values. In an ideal rectangular shaped pulse, transitions between the minimum and maximum values are instantaneous or near-instantaneous.

An electronic driver provides current and voltage to an optical load to cause the optical load to generate optical pulses. An electronic driver for rectangular pulses provides current and voltage to an optical load to cause optical pulses from the optical load to approximate a rectangular shape. Rise-time, fall-time, overshoot, and ripple are examples, among others, of imperfections in the current, voltage, and/or optical pulse that prevent an electronic driver from causing an optical load to provide an ideal rectangular shaped optical pulse.

VCSELs may be used individually and/or in VCSEL arrays as the optical load for the aforementioned 3D sensing applications. VCSELs may be used for generating structured light (e.g., in flood illuminators), time-of-flight (TOF) measurement beams, and/or the like to enable 3D sensing applications. The VCSELs generate optical pulses, such as rectangular shaped pulses, to provide beams that may be used for facial recognition, gesture recognition, and/or the like. VCSELs may be included in smart phone devices, gaming devices, sensing devices, and/or the like.

A VCSEL array may include multiple VCSELs arranged in a particular configuration. For example, a VCSEL array may be arranged with a square grid of VCSELs, a radial grid of VCSELs, a hexagonal grid of VCSELs, a variable spacing grid of VCSELs, a random grid of VCSELs, and/or the like. A particular beam profile may be obtained for a collective output of the VCSEL array (e.g., multiple beams that, at a distance greater than a Rayleigh distance, collectively form a beam) via selection of a corresponding VCSEL array configuration. Parameters of a VCSEL may affect an emission pattern (e.g., a near field emission pattern or a far field emission pattern) of the VCSEL, which may affect operations of a system that includes the VCSEL and/or operations of a VCSEL array that includes the VCSEL. A single die may include one or more VCSEL arrays. A single die including multiple VCSEL arrays may physically separate the arrays or may intermix emitters of different VCSEL arrays. In some cases, all emitters in a VCSEL array operate at a common wavelength (e.g., all emitters in an example VCSEL array may operate at 940 nanometers (nm) or another wavelength that is the same for all the emitters).

SUMMARY

According to some implementations, a charged inductive laser driver may be configured to provide a pre-emphasized current to a first laser load and a second laser load, wherein the pre-emphasized current is configured to achieve a square pulse as a combined output of the first laser load and the second laser load.

According to some implementations, an electrical drive circuit may include a first connection point, wherein the first connection point is an anode for a first laser load; a second connection point, wherein the second connection point is a cathode for a second laser load; a third connection point, wherein the third connection point is a cathode for the first laser load and an anode for the second laser load; a first electrical source connected between the first connection point and a common ground; an inductor connected between the second connection point and a second electrical source, where the second electrical source is connected between the inductor and the common ground; a switch connected between the second connection point and the common ground; and a capacitor connected between the second connection point and the third connection point, wherein the inductor charges when the switch is on.

According to some implementations, an optical device may include a VCSEL array having a first set of VCSELs, and a second set of VCSELs; and may include a charged inductive laser driver connected to the first set of VCSELs and the second set of VCSELs, wherein the charged inductive laser driver is configured with a direct current electrical current path, a first alternating current electrical current path, and a second alternating current electrical current path to drive the first set of VCSELs and the second set of VCSELs with a pre-emphasized current selected to achieve a square pulse as an output of the VCSEL array.

DETAILED DESCRIPTION

Figure 1A:
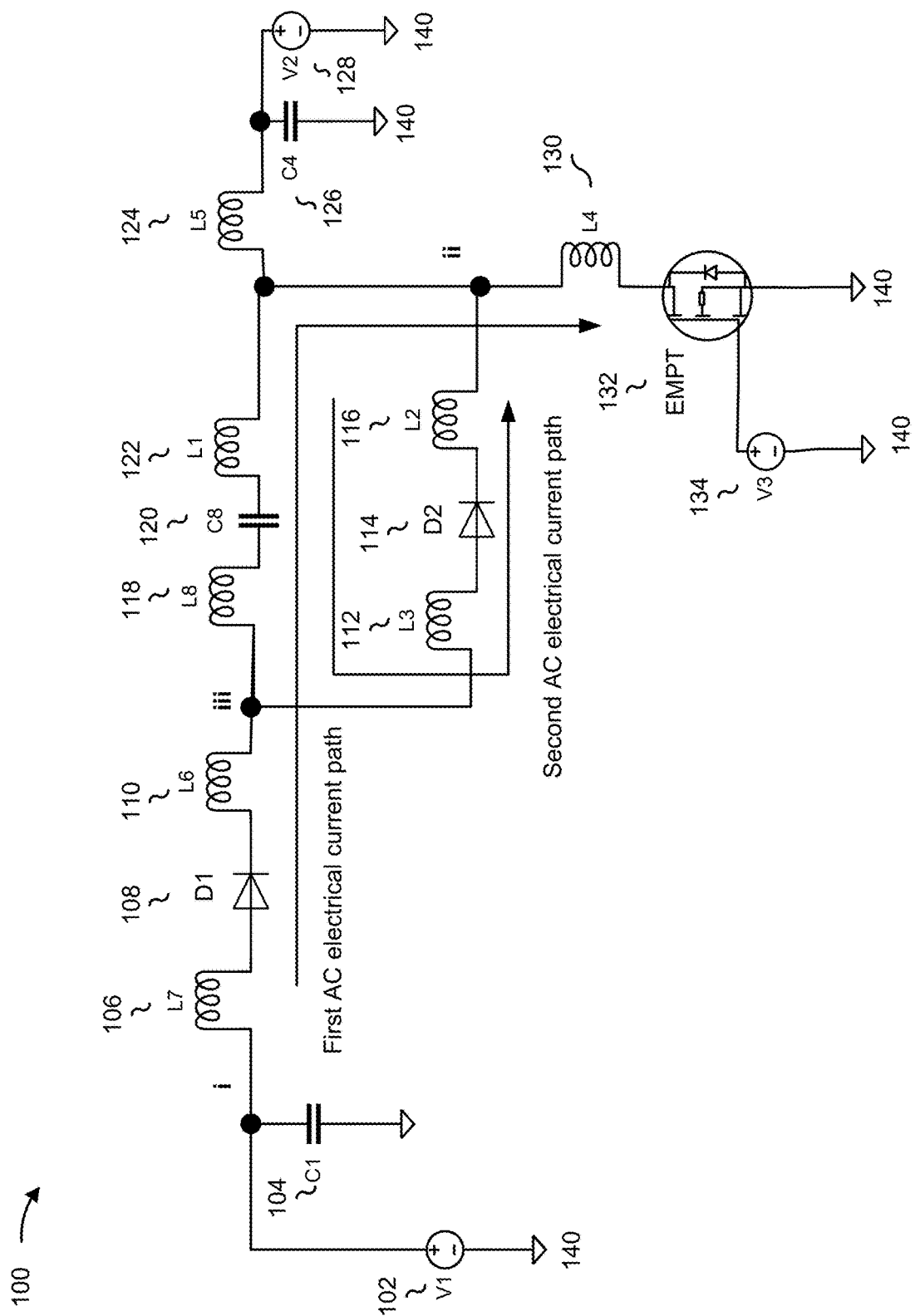
FIGS. 1A-1B and 2 are diagrams of example electrical drive circuits described herein with connected optical loads.

The following detailed description of example implementations refers to the accompanying drawings. The same reference numbers in different drawings may identify the same or similar elements.

Time-of-flight-based (TOF-based) measurement systems, such as 3D sensing (3DS) systems, LIDAR systems, and/or the like, emit optical pulses into a field of view, detect reflected optical pulses, and determine distances to objects in the field of view by measuring delays and/or differences between the emitted optical pulses and the reflected optical pulses. Some systems may have a relatively high pulse repetition rate or modulation frequency (e.g., up to 200 megahertz (MHz)). TOF-based measurement systems may include an electrical drive circuit (e.g., a laser driver) to control the provision of current and voltage to an optical load (e.g., a laser diode, a semi-conductor laser, a VCSEL, a VCSEL array, and/or the like) to emit optical pulses into a field of view. The optical load may also be termed a laser load. The optical pulse may be a rectangular shaped pulse (also referred to as a square pulse, a square wave, or a pulse wave, among other examples) that is a non-sinusoidal periodic waveform in which an amplitude alternates at a steady frequency between fixed minimum and maximum values, ideally with instantaneous or near-instantaneous transitions between the minimum and maximum values.

In general, emitting an optical pulse that has a well-defined origin in time and a rectangular shape may improve measurement precision and accuracy (e.g., as compared to optical pulses having a non-rectangular shape, a long rise time, a poorly-defined origin in time, and/or the like). To achieve such a rectangular shape, an emitted optical pulse should generally have a short rise time (e.g., a time during which power of the optical pulse is rising) and a short fall time (e.g., a time during which power of the optical pulse is falling). For example, the rise time of an optical pulse may be a time during which power of the optical pulse rises from 10% of peak power to 90% of peak power, and may be referred to as a 10%-90% rise time. Similarly, the fall time of an optical pulse may be a time during which power of the optical pulse falls from 90% of peak power to 10% of peak power, and may be referred to as a 90%-10% fall time. Thus it may be advantageous to design an electrical drive circuit that minimizes rise time. In some configurations, multiple electrical drivers may be deployed to achieve a minimized rise time with a rectangular shaped pulse. However, such configurations that minimize rise time may cause an undesirable level of electrical power usage and/or loss.

Some implementations described herein provide a method and/or an electrical drive circuit for driving an optical load to emit a rectangular shaped optical pulse using current pre-emphasis. When using current pre-emphasis, some implementations described herein may include, among other components, a switch, an inductor to store and discharge current, one or more capacitors in parallel and a voltage source. When a switch is closed, an inductor may store energy and when the switch is opened the inductor may discharge a DC current that excites LC tank circuitry, in addition to a direct current (DC current), received from a main voltage source when the switch is closed, causing alternating current (AC current) oscillations that shorten a rise time of a resulting pulse. For example, as described herein, the optical load may be driven to emit an optical pulse that has a short rise time (e.g., less than 100 picoseconds (ps)), a short fall time (e.g., less than 500 ps, less than 300 ps, and/or the like), and/or a flat top of the pulse. An total electrical power loss may be less than in a prior art. For example, some implementations described herein may use an electrical drive circuit that includes a driver, a first connection point, a first laser load, a second connection point, a second laser load, and a third connection point (where the first laser load is between the first and third connection points, and the second laser load is between the third and second connection points). In this case, the first connection point may serve as an anode for the first laser load, the third connection point may serve as a cathode for the second laser load, and the second connection point may serve as a cathode for the first laser load and an anode for the second laser load. As a result, a single driver may drive two laser loads (the second laser load's rise time may be delayed relative to the first laser load's rise time by a half of resonance frequency period) with a pre-emphasized current to achieve, in combination, for example, a square pulse with the rise time of less than a 100 ps, for example. Moreover, based at least in part on achieving an optical pulse with a relatively short rise time and a low level of electrical losses, an electrical drive circuit described herein may be used, for example, for 3DS applications with a relatively high pulse repetition rate or modulation frequency (e.g., a modulation frequency of up to 200 MHz).

Figure 1B:
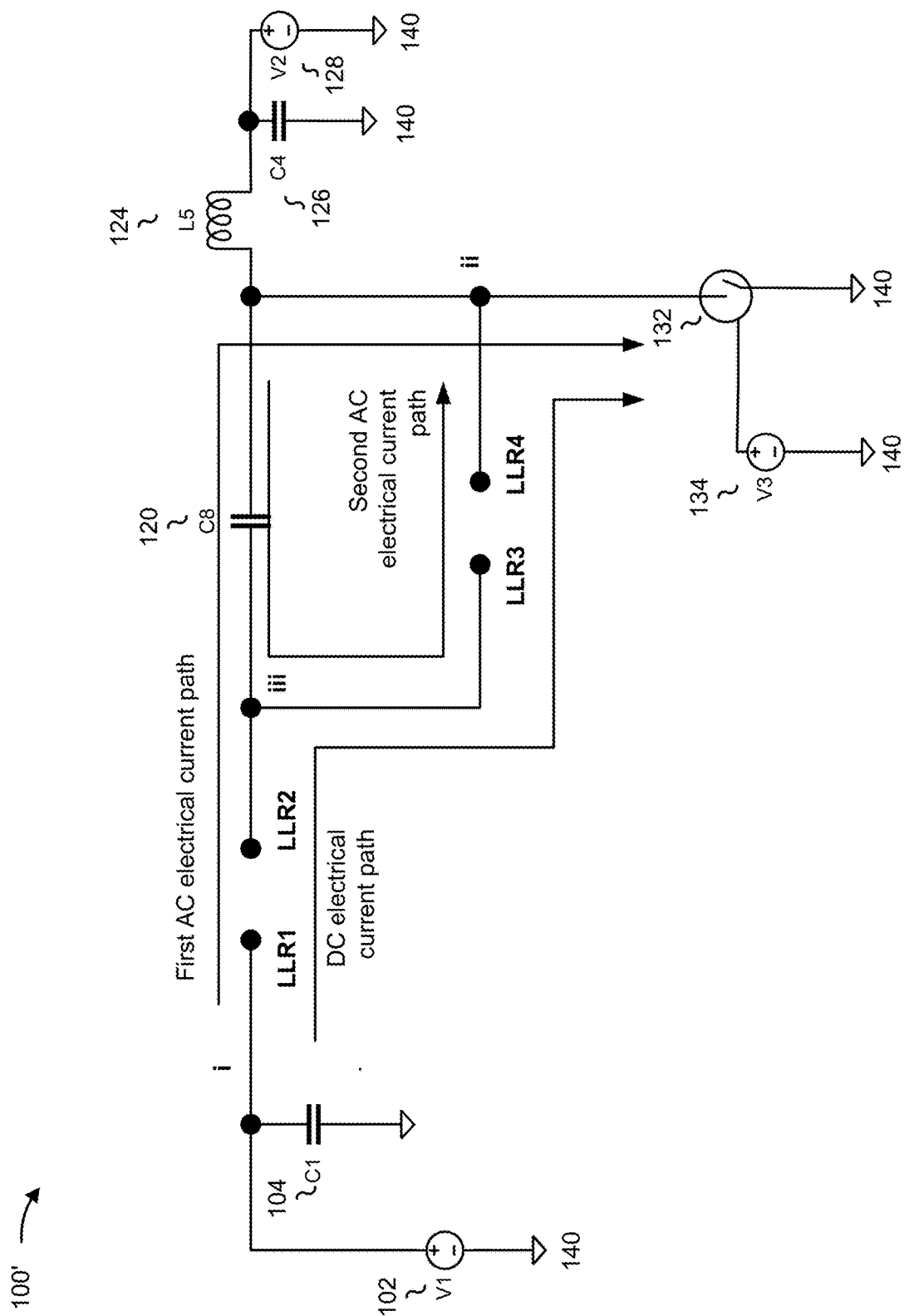

FIGS. 1A and 1B are circuit diagrams of equivalent models of an example electrical drive circuit 100/100' described herein. As shown in FIG. 1A, the electrical drive circuit 100 may include a voltage source 102 (connected to a common ground 140), a capacitor 104 (an auxiliary capacitor connected to the common ground 140 and in parallel with the voltage source 102), a parasitic inductor 106, a first laser load 108, a parasitic inductor 110, a parasitic inductor 112, a second laser load 114, a parasitic inductor 116, a parasitic inductor 118, a capacitor 120, a parasitic inductor 122, an inductor 124, a capacitor 126 (an auxiliary capacitor connected to the common ground 140 and in parallel with a voltage source 128), the voltage source 128 (connected to the common ground 140), a parasitic inductor 130, an enhancement-mode metal-oxide-semiconductor field-effect transistor (MOSFET) 132 (connected to the common ground 140), and a voltage source 134 (connected to the common ground 140). Although some implementations are described herein in terms of a particular set of components, additional components, fewer components, or a different combination of components may be possible.

The aforementioned parasitic inductors may, in some implementations, be included for more precisely modelling an example electrical drive circuit such that a simulation based on the example electrical drive circuit more closely approximates a measured performance. The parasitic inductors (and other parasitic elements) may be explicit in the model but may be inherent to a physical implementation of an electrical drive circuit described herein. For example, the parasitic inductors in the circuit diagram simulate some of the inherent effects of the electrical connectivity (e.g. component leads, pads, traces, wire, bonds, wire bonds, bond pads, solder, vias, etc.) between components of an electrical drive circuit described herein. Although some implementations are described herein in terms of a particular set of components, additional components, fewer components, or a different combination of components may be possible.

In some implementations, voltage sources 102/128/134 may include a direct current (DC) voltage source, a regulator, a DC-DC converter, an alternating current (AC)-DC converter, or another type of source to supply a DC voltage. In some implementations, first laser load 108 and/or second laser load 114 may include a component to emit an optical pulse. For example, first laser load 108 and/or second laser load 114 may include a laser diode, a VCSEL, an edge emitter, a multi-junction laser, a semi-conductor laser, a semi-conductor laser load, a semi-conductor laser diode or an array thereof, among other examples. In this case, first laser load 108 may include a first quantity of emitters, and second laser load 114 may include a second quantity of emitters that is approximately equal to the first quantity of emitters (e.g., to achieve approximately equal optical power outputs, as described herein). In some implementations, the first laser load 108 and the second laser load 114 are provided separately or independently from the electrical drive circuit 100, this is common where the electrical drive circuit is manufactured and/or sold independently of the lasers. In some implementations, the first laser load 108 and/or the second laser load 114 may be integrated into the electrical drive circuit 100. In some implementations, an integrated circuit may be created that includes some components of the electrical drive circuit 100 and either or both of the laser loads 108, 114. In some implementations, a multi-VCSEL array may include a first VCSEL that includes the first laser load 108, and a second VCSEL that includes the second laser load 114. In some implementations, the emitters of different lasers of a multi-VCSEL array are interspaced.

In some implementations, electrical drive circuit 100 may be provided in a particular form factor. For example, discrete components of electrical drive circuit 100 may be assembled together on a printed circuit board and/or substrate. Additionally, or alternatively, one or more of the components of electrical drive circuit 100 may be integrated as a monolithic driver integrated circuit (e.g., semi-conductor) chip. In some implementations, one or more components of electrical drive circuit 100 may be partially integrated with a laser load 108/114. In some implementations, the electrical drive circuit 100 may be assembled on a single substrate and integrated into a single device. Accordingly, the electrical drive circuit 100 may include an interface for a laser load 108/114 that may include one or more connection points, connection points, electrodes, traces, and/or other elements to connect a laser load 108/114 to the electrical drive circuit 100, depending on the particular form of electrical drive circuit 100. In some implementations, electrical drive circuit 100 and/or laser first load 108 and/or second laser load 114 may include or interface with one or more passive optical elements (not shown), such as a lens, a diffuser, or a transparent cover, among other examples. For example, first laser load 108 may be disposed within a threshold proximity of second laser load 114, such that the laser loads 108/114 share the same passive optical element (e.g., the same lens or diffuser). Locating the first laser load 108 and the second laser load 114 proximate to one another is advantageous to minimize differences in the field of view between each laser load. If there was a large spacing between the two laser loads 108/114, the arrival time of light form the two lasers in the coplanar plane will differ at extreme angles of the field of view causing the shape of the optical pulse to distort (e.g., a sloped or tilted top of the optical pulse).

As further shown in FIG. 1A, second laser load 114 is in parallel with capacitor 120. This configuration enables driving of first laser load 108 and second laser load 114 with a single charged inductor driver that provides a pre-emphasized current to both laser loads 108/114 (time-shifted based on a resonant period of the pre-emphasized current) to cause a rectangular shaped (e.g., square shaped) pulse to be emitted. In some implementations, first laser load 108 may be associated with a first operating wavelength (e.g., 940 nanometers (nm), 1.5 millimeters (mm), among other examples) and second laser load 114 may be associated with a second operating wavelength that is approximately equal to the first operating wavelength, such as within 9.4 nm, within 15 nm, among other examples. In this case, based on the first operating wavelength being approximately equal to the second operating wavelength, a collective output of the first laser load 108 and the second laser load 114 may be combined to form a rectangular shaped pulse.

In some implementations, electrical drive circuit 100 may have a first AC electrical current path through the first laser load 108 and capacitor 120, and the second AC electrical current path through capacitor 120 and second laser load 114, in which a second AC electrical current may be generated (e.g., as a result of, for example, voltage source 128, among other examples) to be a complement to the first AC current (e.g., 180 degrees phase shifted and opposite in amplitude), such that the first AC current, when provided to laser load 108, and the second AC current, when provided to laser load 114, cause laser loads 108/114 to produce an optical pulse having a rectangular (e.g., square) wave shape with a defined rise time. In this case, additionally, or alternatively, a first laser load's 108 rise time of the current and a second laser load's 114 rise time of the current may be selected to achieve the rectangular wave shape, based at least in part on a resonance of the tank circuitry, comprised of the capacitor 120 and parasitic inductors (112, 116, 118 and/or 122) associated with electrical drive circuit 100.

FIG. 1B shows a simplified example electrical drive circuit 100' configured for receiving two laser loads, such as two optical diode sources. As shown in FIG. 1B, electrical drive circuit 100' includes a first connection point i, a second connection point ii, and a third connection point iii, a set of laser load receivers (LLRs), a capacitor 120, an inductor 124, and voltage source 128, among other components. A first laser load receiver (LLR1) and a second laser load receiver (LLR2) may be disposed between the first connection point i and the third connection point iii. Similarly, a third laser load receiver (LLR3) and a fourth laser load receiver (LLR4) may be disposed between the third connection point iii and the second connection point ii. LLR1/LLR2 and LLR3/LLR4 may be pads or other electrical connection points that may receive a laser load (e.g., during assembly of an optical device for manufactured laser loads may be attached to a separately manufactured electrical drive circuit). As further shown in FIG. 1B, electrical drive circuit 100' may provide, for a subsequently attached set of laser loads, a first AC electrical current path, a second AC electrical current path, and a DC electrical current path. In this case, when a switch is closed, voltage source 128, among other components, charges inductor 124. When the switch is open, inductor 124 discharges stored energy, feeding resonant oscillations in LC tank circuitry that includes capacitor 120 and circuit parasitic inductances. In this way, electrical drive circuit 100' provides pre-emphasized AC currents into connected laser loads.

As indicated above, FIGS. 1A and 1B are provided as examples. Other examples may differ from what is described with regard to FIGS. 1A and 1B.

Figure 2:
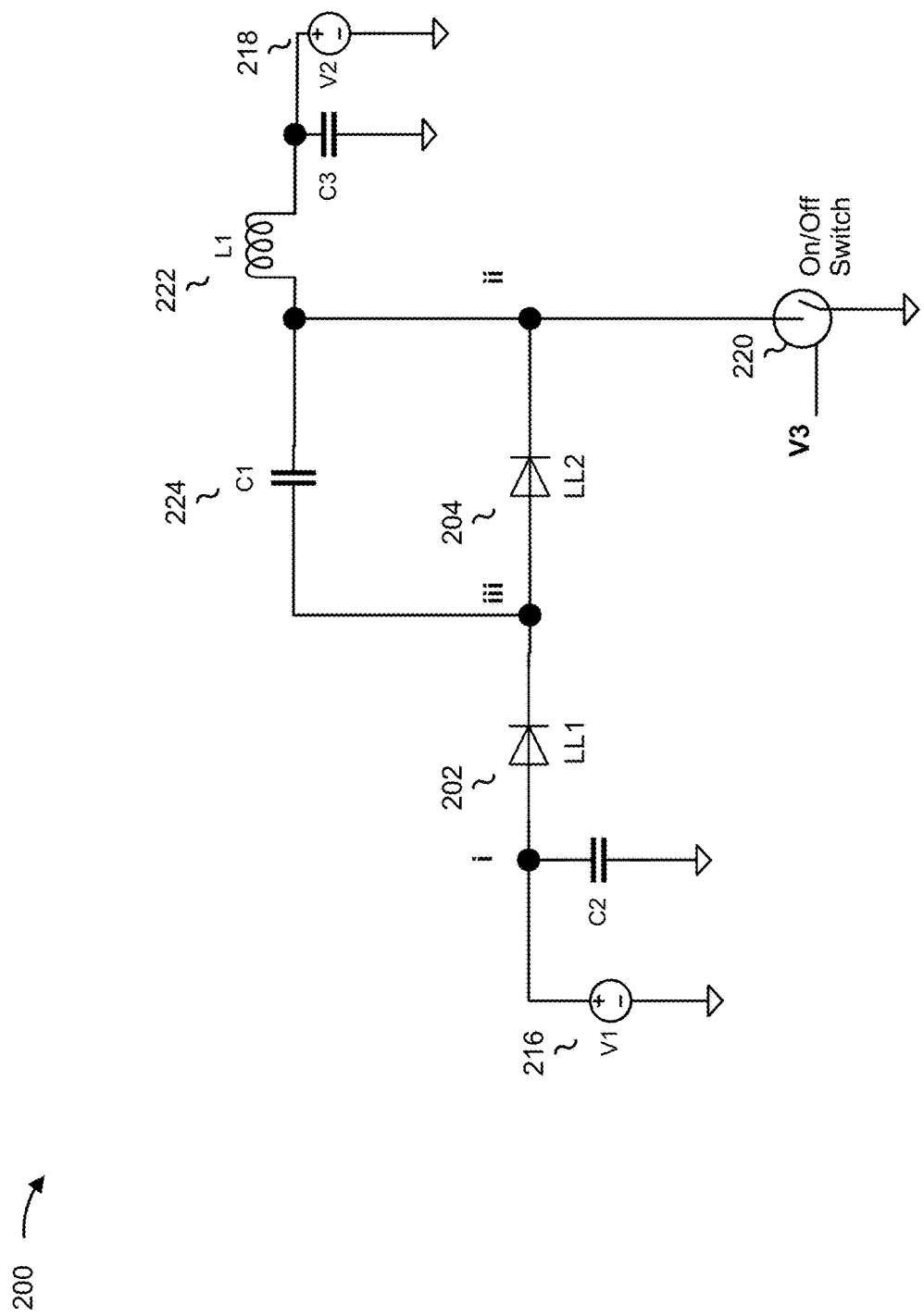

FIG. 2 is a diagram of an example electrical drive circuit 200 described herein. As shown in FIG. 2, the electrical drive circuit 200 includes a first laser load 202 and a second laser load 204. Electrical drive circuit 200 may further include a set of connection points i, ii, and iii. For example, first laser load 202 may be disposed in electrical drive circuit between connection point i and connection point iii, and second laser load 204 may be disposed in electrical drive circuit 200 between connection point iii and connection point ii, such that first laser load 202 and second laser load 204 are in series. In some implementations, connection points i, ii, and iii may form one or more anodes or cathodes for driving laser loads 202 and 204. For example, connection point i may form an anode for first laser load 202, and connection point iii may form a cathode for first laser load 202. Similarly, connection point iii may form an anode for second laser load 204, and connection point ii may form a cathode for second laser load.

At a first time, $t_1$, switch 220 (e.g., a single switch to cause a driver to provide a pre-emphasized current to both first laser load 202 and second laser load 204) may change to an on state (e.g., which may be a closed state of switch 220) to cause DC current to flow into laser loads 202 and 204 from the voltage source 216, as well as to cause inductor 222 to charge from the voltage source 218. For example, inductor 222 may store energy when switch 220 is in the on state. In some implementations, voltage sources 216 and 218 may provide a voltage of 1 volt (V), 4 V, up to 10 V, or up to 30 V, among other examples. In some implementations, first voltage source 216 may have a voltage of 4 V and second voltage source 218 may have a voltage of 9 V (in this case, capacitor 224 may have a capacitance in the range of 100 to 1500 picofarads (pF) and inductor 222 may have an inductance value in the range of 50 to 500 nanohenries (nH)). The voltage level may be configured based, at least in part, on a desired peak laser current, and a ratio of a first voltage $V_1$ of voltage source 216 to a second voltage $V_2$ of voltage source 218 may be configured to achieve a square shaped pulse in connection with a design of electrical drive circuit 200.

When switch 220 changes to an off state (e.g., which may be an open state of switch 220), at a second time, $t_2$, the stored energy excites LC tank circuitry, comprised of capacitor 224 and circuit parasitic inductances. At a third time, $t_3$, the voltage at connection point iii has a negative spike, providing pre-emphasized current spike into first laser load 202. Capacitor 224 value may adjust an AC oscillation frequency, which may control a rise time and fall time of the optical pulse. Similarly, inductor 222 may create a triangular ripple current based on a pulse repetition rate and laser peak current. In this way, inductor 222 and capacitor 224 enable a relatively fast rise time at first laser load 202. In some implementations, the overshoot to first laser load 202 results in a peak current that is approximately double an average current in first laser load 202 and in second laser load 204.

At a fourth time, $t_4$, a dumped relaxation oscillation occurs in a segment or portion of electrical drive circuit 200 defined by capacitor 224 (and one or more inductors connected thereto), Connection point ii, second laser load 204, and Connection point iii. In this case, the dumped relaxation oscillation causes a positive voltage spike at connection point iii at the fourth time $t_4$, and causes a delayed current spike at second laser load 204. In this way, the segment of electrical drive circuit 200 enables a relatively short rise time at second laser load 204. In some implementations, a first rise time in first laser load 202 may be delayed from a second rise time in second laser load 204. For example, the first rise time and the second rise time may be delayed by a half period of parasitic resonance in the aforementioned segment of electrical drive circuit 200.

In this way, by achieving relatively short rise times at laser loads 202 and 204 (faster rise times than is achieved using other techniques), electrical drive circuit 200 enables a pulse peak to be achieved with a reduced pulse width relative to other techniques, which reduced power consumption and enables faster pulse repetition rate to achieve a particular level of resolution.

As indicated above, FIG. 2 is provided as an example. Other examples may differ from what is described with regard to FIG. 2.

Figure 3:
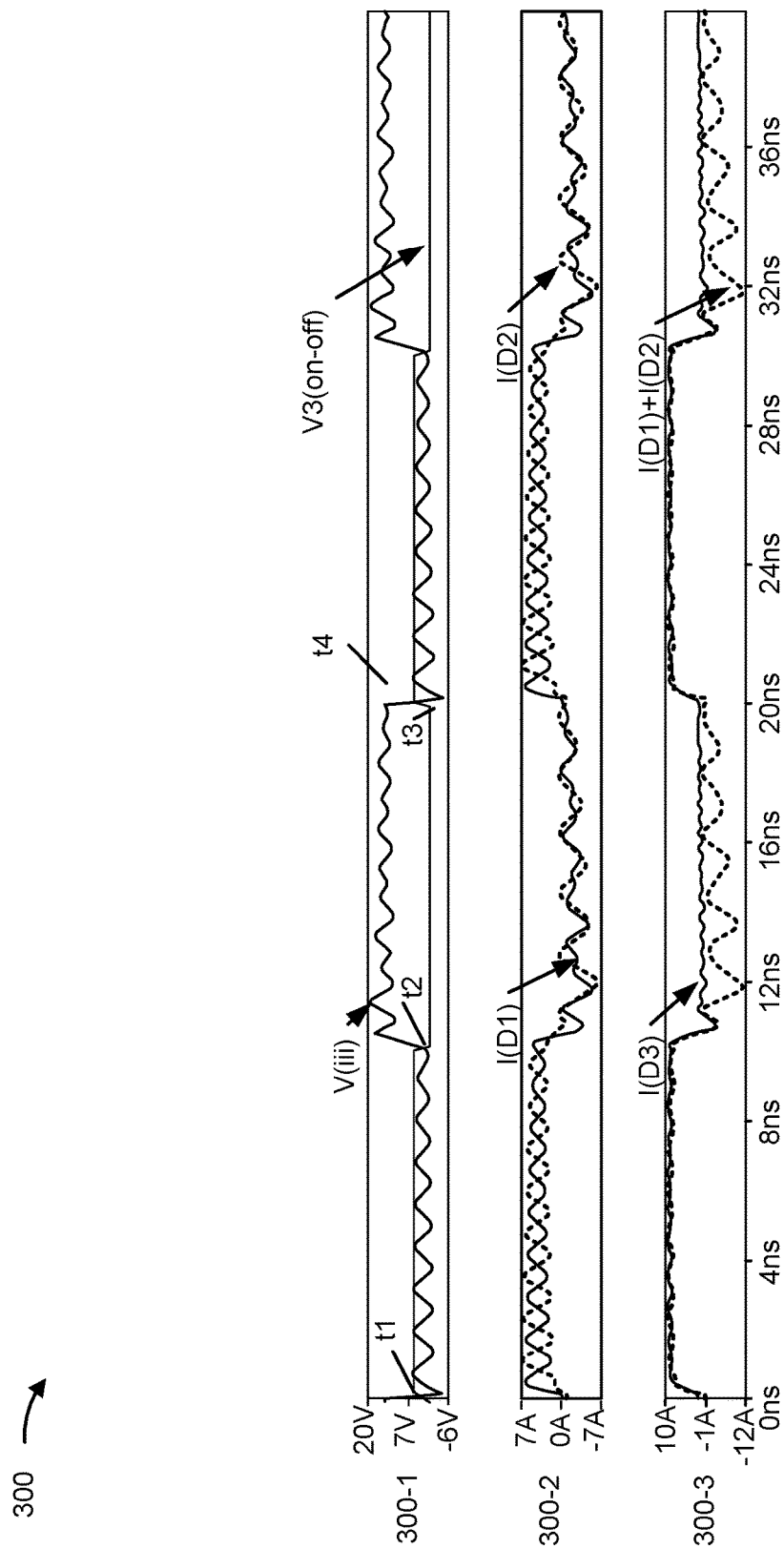
FIGS. 3-5 are diagrams of example plots related to the performance and/or operation of an electrical drive circuit described herein with connected optical loads.
Figure 4:
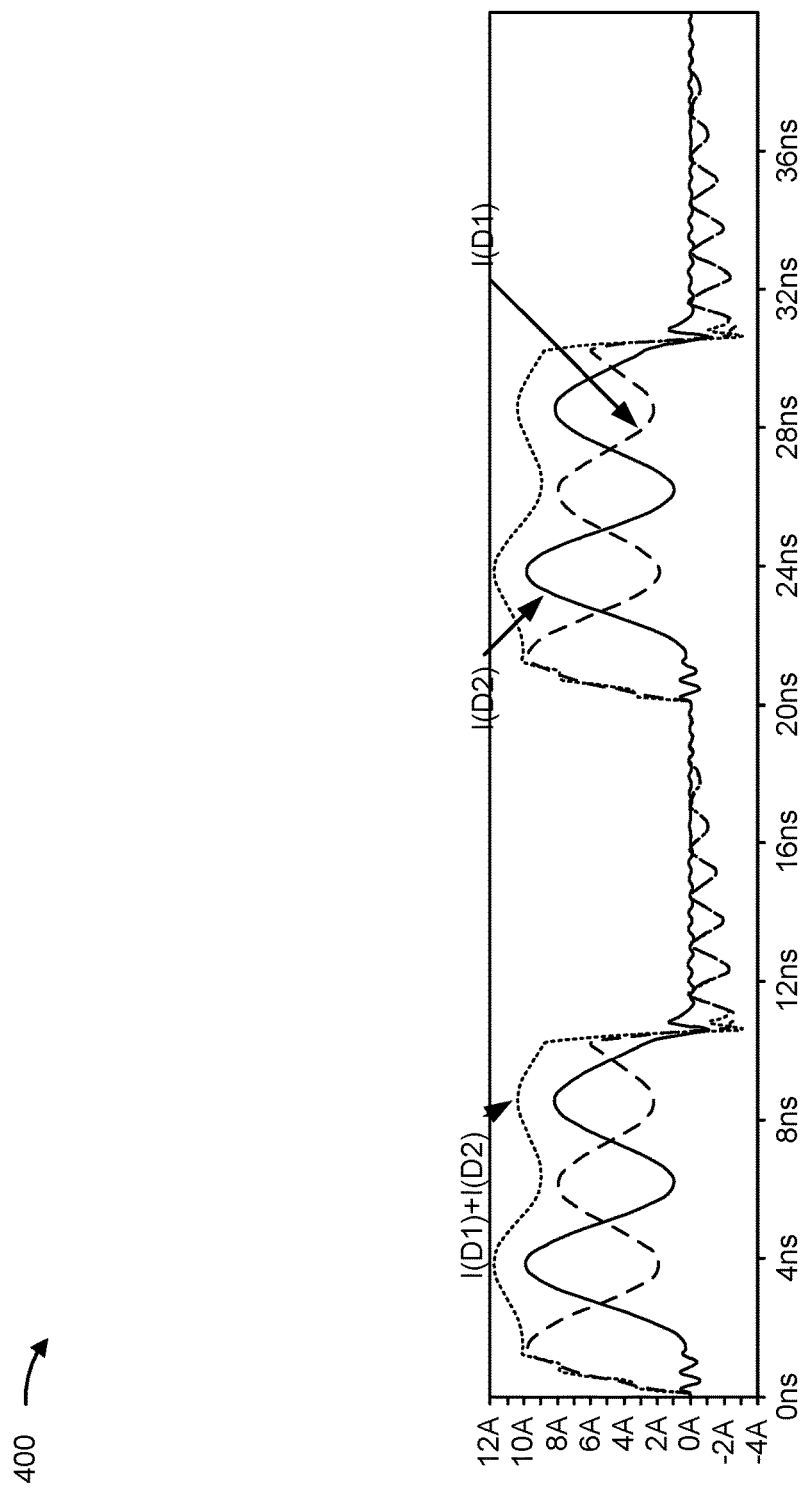
Figure 5:
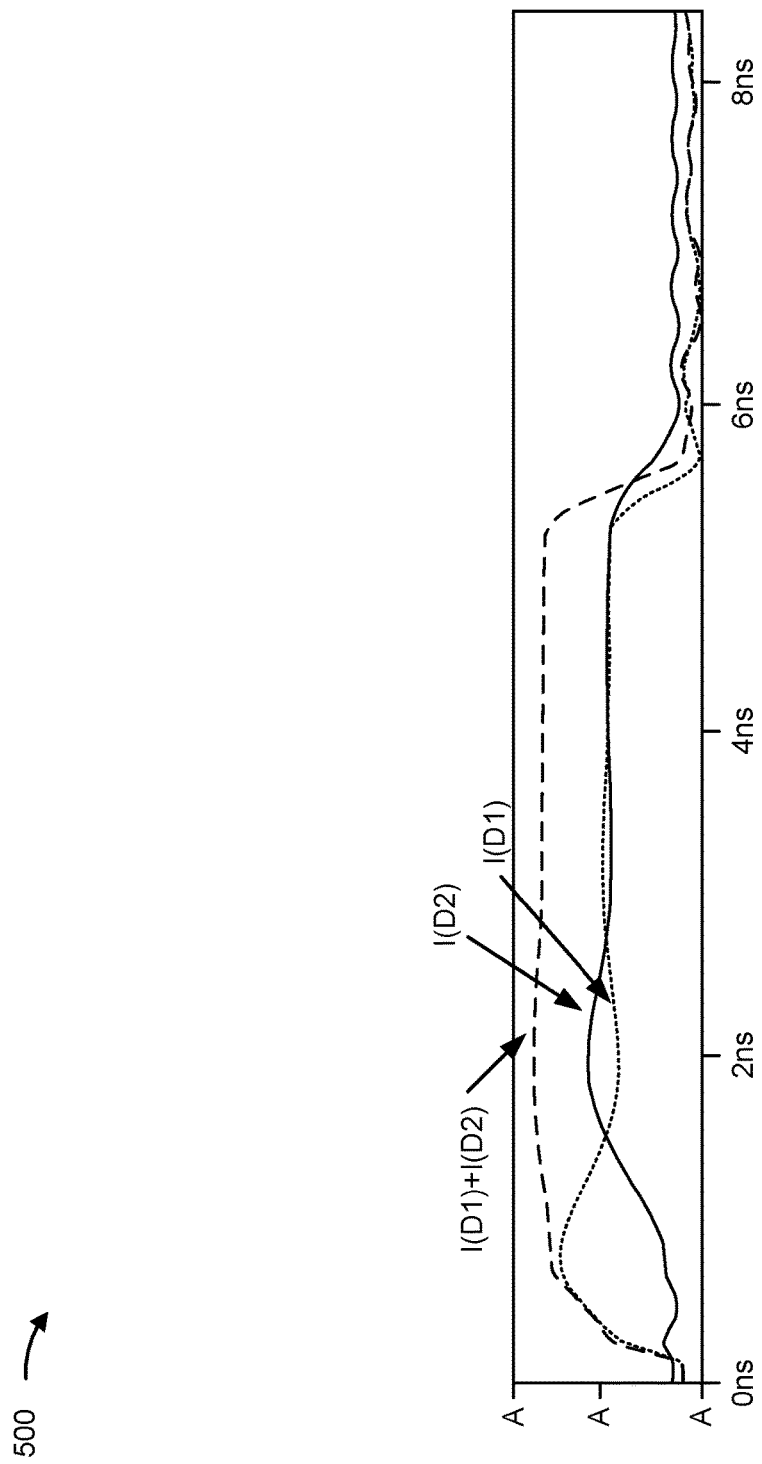

FIGS. 3-5 are diagrams of example plots 300-500 of operation of an electrical drive circuit described herein.

FIG. 3 shows a set of example plots 300 of a voltage and current in an electrical drive circuit described herein. For example, plot 300-1 shows an example control drive voltage V3 (on-off) of the electrical drive circuits 100/100'/200. Plot 300-2 shows an example of a current I(D1) in a first laser load (e.g., first laser load 108 or first laser load 202) relative to a current I(D2) in a second laser load (e.g., second laser load 114 or second laser load 204). Plot 300-3 shows a current I(D3) of a cathode-pull type of laser driver compared with a net current, I(D1)+I(D2), from an electrical drive circuit described herein (e.g., a sum of current I(D1) and current I(D2)). In this case, as shown, an electrical drive circuit described herein achieves a similar square shaped optical pulse to a cathode-pull type of laser driver, with reduced electrical power losses relative to the cathode-pull type of laser driver.

FIGS. 4 and 5 show example plots 400 and 500 of a current in an electrical drive circuit described herein with higher value of capacitor 120 than for example plots 300, which may result in a lower oscillating frequency than is shown in plots 300. For example, plots 400 and 500 show an example of a current I(D1) at a first laser load (e.g., first laser load 108 or first laser load 202), a current I(D2) at a second laser load (e.g., second laser load 114 or second laser load 204), and a net current, I(D1)+I(D2), from an electrical drive circuit described herein (e.g., a sum of current I(D1) and current I(D2)). In this case, as shown, configurations of electrical drive circuits described herein (e.g., the presence of particular components, such as inductors or capacitors, among other examples) result in alternating sinusoidal currents providing a net current that creates a square shaped pulse. In other words, a shape of an optical pulse provided as a net optical pulse by a first laser load and a second laser load, as described herein, corresponds to a shape of a net current provided to the first laser load and the second laser load.

As indicated above, FIGS. 3-5 are provided as examples. Other examples may differ from what is described with regard to FIGS. 3-5.

Figure 6:
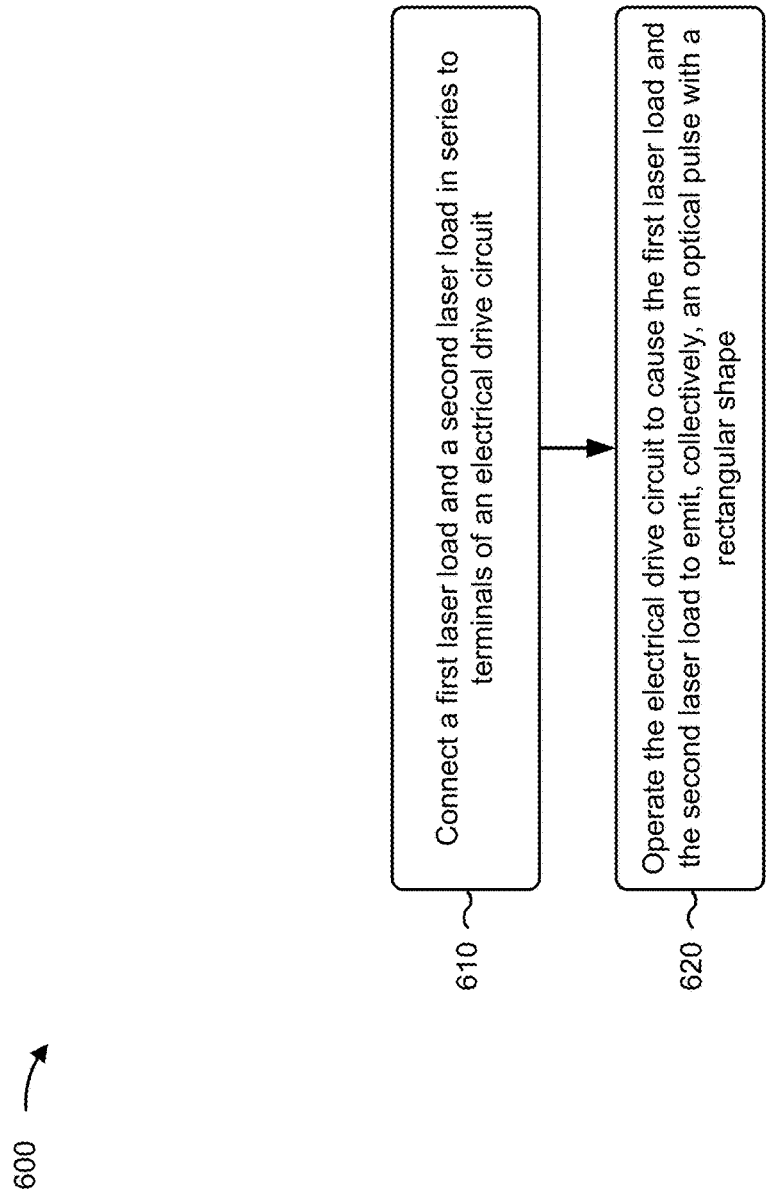
FIG. 6 is a flowchart of an example process relating to driving optical loads to emit rectangular shaped optical pulses using current pre-emphasis.

FIG. 6 is a flowchart of an example process 600 relating to driving an optical load to emit rectangular shaped optical pulses using current pre-emphasis. In some implementations, one or more process blocks of FIG. 6 may be performed by an electrical drive circuit (e.g., an electrical drive circuit as shown in and/or described above with respect to FIGS. 1-5), a charged inductive laser driver, a multi-VCSEL array, a time-of-flight-based measurement system (e.g., a direct time-of-flight-based measurement system, an indirect time-of-flight-based measurement system, and/or the like), a 3D sensing system, a LIDAR system, a controller, and/or the like. Additionally, or alternatively, one or more process blocks of FIG. 6 may be performed by one or more components of an electrical drive circuit, a charged inductive laser driver, a multi-VCSEL array, an optical device, a time-of-flight-based measurement system, a 3D sensing system, a LIDAR system, a controller, and/or the like.

As shown in FIG. 6, process 600 may include connecting a first laser load and a second laser load in series to connection points of an electrical drive circuit (block 610). For example, an optical load may be connected to an electrical drive circuit such that a first connection point forms an anode for the first laser load, a second connection point forms a cathode for the second laser load, and a third connection point forms a cathode for the first laser load and an anode for the second laser load, as described above. In some implementations, the laser load may be a laser diode, a VCSEL, an edge emitter, a multi-junction laser, a semi-conductor laser or arrays of any of the preceding optical loads, among other examples. Additionally, or alternatively, in some aspects, the laser load and the electrical drive circuit may be assembled on the same substrate and integrated as a single device.

As further shown in FIG. 6, process 600 may include operating the electrical drive circuit to cause the first laser load and the second laser load to emit, collectively, an optical pulse with a rectangular shape (block 620). For example, process 600 may include closing a switch to provide a main current to the laser loads. In addition, when the switch is closed, process 600 may include providing a compensation current to the laser loads, as described above. In some implementations, process 600 may include combining the main current and the compensation current such that a rise time of the main current and a fall time of the compensation current are complementary in time and amplitude to form an optical pulse with a rectangular shape.

In some implementations, the electrical drive circuit may drive the first laser load with a pre-emphasized current and a rising edge overshoot. For example, the electrical drive circuit may provide the pre-emphasized current with the rising edge overshoot to the first laser load to compensate for a delayed current at the second laser load. In this case, the overshoot amplitude and/or duration is selected to cause a net output of the first laser load and the second laser load to achieve a square pulse shape with a particular pulse width. In some implementations, the first laser load may generate a longer optical pulse than the second laser load. For example, the first laser load may produce a higher amount of optical power than an amount of optical power produced by the second laser load (e.g., as a result of a pre-emphasized front edge relative to the second laser load), which may enable generation of the square pulse shape. Additionally, or alternatively, the first laser load and the second laser load may produce approximately equal optical powers to achieve the square pulse shape. In some implementations, a difference in optical pulse durations between the two laser loads may be approximately equal to half of a resonant tank period of the aforementioned segment, of the electrical drive circuit 200, that includes capacitor 224 and second laser load 204. For example, a first pulse duration from a first laser load and a second pulse duration from a second laser load may be based at least in part on a resonant tank period of the electrical drive circuit (e.g., a segment of the electrical drive circuit that includes a capacitor and the second laser load, as described above).

Process 600 may include additional implementations, such as any single implementation or any combination of implementations described above and/or in connection with one or more other processes described elsewhere herein.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like. As used herein, an approximate value may, depending on the context, refer to a value within +1-10% of the stated value.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An electrical drive circuit, comprising:
a first connection point, wherein the first connection point is connected to an anode for a first laser load;
a second connection point, wherein the second connection point is connected to a cathode for a second laser load;
a third connection point between the first laser load and the second laser load,
wherein the third connection point is connected to a cathode for the first laser load and connected to an anode for the second laser load such that the first laser load and the second laser load are in series, wherein the first laser load is between the first connection point and the third connection point, and
wherein the second laser load is connected between the third connection point and the second connection point;
a first electrical source connected between the first connection point and a common ground;
an inductor connected between the second connection point and a second electrical source, wherein the second electrical source is connected between the inductor and the common ground;
a switch connected between the second connection point and the common ground;
a capacitor connected between the second connection point and the third connection point, wherein the inductor charges when the switch is on; and
a set of parasitic inductances forming, with the capacitor, a first LC circuit with the first laser load and a second LC circuit with the second laser load,
wherein the switch, when opened, discharges a current from the inductor that excites the first LC circuit and the second LC circuit causing alternating currents in the first laser load and the second laser load.

2. The electrical drive circuit of claim 1, further comprising:
an auxiliary capacitor connected in parallel with the first electrical source.

3. The electrical drive circuit of claim 1, further comprising:
an auxiliary capacitor connected in parallel with the second electrical source.

4. The electrical drive circuit of claim 1, wherein the switch is connected to cause the electrical drive circuit to provide a pre-emphasized current to the first laser load and the second laser load.

5. The electrical drive circuit of claim 4, wherein the pre-emphasized current is configured to achieve a square pulse as a combined output of the first laser load and the second laser load.

6. The electrical drive circuit of claim 1, wherein:
a first alternating current electrical path includes the first connection point, first and second laser load receivers (LLRs) for the first laser load, the third connection point, the capacitor, the second connection point, and the switch; and
the first and second LLRs are disposed between the first connection point and the third connection point.

7. The electrical drive circuit of claim 6, wherein:
a second alternating current electrical path includes the capacitor, the third connection point, third and fourth LLRs for the second laser load, and the second connection point; and
the third and fourth LLRs are disposed between the third connection point and the second connection point.

8. The electrical drive circuit of claim 1, wherein the electrical drive circuit is configured to achieve a first rise time in the first laser load and a second rise time in the second laser load, and
wherein the first rise time and the second rise time are based at least in part on a period of a parasitic resonance associated with the second laser load and the capacitor.

9. The electrical drive circuit of claim 1, wherein the first laser load is associated with a first optical power and the second laser load is associated with a second optical power.

10. The electrical drive circuit of claim 1, wherein the first laser load is associated with a first quantity of emitters and the second laser load is associated with a second quantity of emitters.

11. The electrical drive circuit of claim 1, wherein the first laser load is associated with a first set of vertical cavity surface emitting lasers (VCSELs) and the second laser load is associated with a second set of VCSELs.

12. The electrical drive circuit of claim 1, wherein the switch comprises a metal-oxide-semiconductor field-effect transistor.

* * * * *